United States Patent
Kawashima et al.

(10) Patent No.: US 11,372,326 B2
(45) Date of Patent: Jun. 28, 2022

(54) PELLICLE COMPRISING GRAPHITE THIN FILM

(71) Applicants: KANEKA CORPORATION, Osaka (JP); UNIVERSITY OF HYOGO, Hyogo (JP)

(72) Inventors: Yuki Kawashima, Osaka (JP); Shuhei Ozaki, Osaka (JP); Masamitsu Tachibana, Osaka (JP); Takeo Watanabe, Hyogo (JP); Tetsuo Harada, Hyogo (JP)

(73) Assignees: KANEKA CORPORATION, Osaka (JP); UNIVERSITY OF HYOGO, Hyogo (JP)

(*) Notice: Subject to any disclaimer, the term of this patent is extended or adjusted under 35 U.S.C. 154(b) by 39 days.

(21) Appl. No.: 17/012,912

(22) Filed: Sep. 4, 2020

(65) Prior Publication Data
US 2020/0401038 A1 Dec. 24, 2020

Related U.S. Application Data

(63) Continuation of application No. PCT/JP2019/008330, filed on Mar. 4, 2019.

(30) Foreign Application Priority Data

Mar. 9, 2018 (JP) .............................. JP2018-043100

(51) Int. Cl.
G03F 1/62 (2012.01)
G03F 1/64 (2012.01)

(52) U.S. Cl.
CPC . G03F 1/62 (2013.01); G03F 1/64 (2013.01)

(58) Field of Classification Search
CPC ................................... G03F 1/62; G03F 1/64
USPC .......................................................... 430/5
See application file for complete search history.

(56) References Cited

U.S. PATENT DOCUMENTS

| | | | |
|---|---|---|---|
| 10,539,868 B2* | 1/2020 | Shin | ....................... G03F 1/62 |
| 2013/0088699 A1 | 4/2013 | Yakunin et al. | |
| 2014/0160455 A1 | 6/2014 | Yakunin et al. | |
| 2016/0147141 A1 | 5/2016 | Ono et al. | |
| 2017/0017150 A1 | 1/2017 | Yakunin et al. | |
| 2018/0004082 A1 | 1/2018 | Song et al. | |
| 2018/0049306 A1 | 2/2018 | Murakami et al. | |
| 2018/0259846 A1 | 9/2018 | Yakunin et al. | |
| 2019/0159330 A1 | 5/2019 | Murakami et al. | |

FOREIGN PATENT DOCUMENTS

| | | |
|---|---|---|
| EP | 3285264 A1 | 2/2018 |
| JP | 2013-534727 A | 9/2013 |
| JP | 2015171968 A | 10/2015 |
| WO | 2014188710 A1 | 11/2014 |

OTHER PUBLICATIONS

K. Nagashio, et al., "Systematic Investigation of the Intrinsic Channel Properties and Contact Resistance of Monolayer and Multilayer Graphene FET", J. Appl. Phys., May 2010, No. 49, 051304 (13 pages).

Y. Zhang et al., "Fabrication and electric-field-dependent transport measurements of mesoscopic graphite devices", Appl. Phys. Lett., 2005, No. 86, 073104 (3 pages).

International Search Report issued in International Application No. PCT/JP2019/008330, dated Apr. 9, 2019 (2 pages).

Written Opinion issued in International Application No. PCT/JP2019/008330, dated Apr. 9, 2019 (5 pages).

Extended European Search Report issued in corresponding European Patent Application No. EP 19763403.3 dated Nov. 2, 2021 (7 pages).

* cited by examiner

*Primary Examiner* — Christopher G Young

(74) *Attorney, Agent, or Firm* — Osha Bergman Watanabe & Burton LLP

(57) ABSTRACT

The present disclosure relates to a pellicle that can achieve both a high EUV transmittance and a uniformity in EUV transmittance by including a graphite thin film having a film thickness of 5 nm or more and 30 nm or less and a surface roughness (Sa) of 0.1 nm or more and 500 nm or less.

13 Claims, 1 Drawing Sheet

[Figure 1]
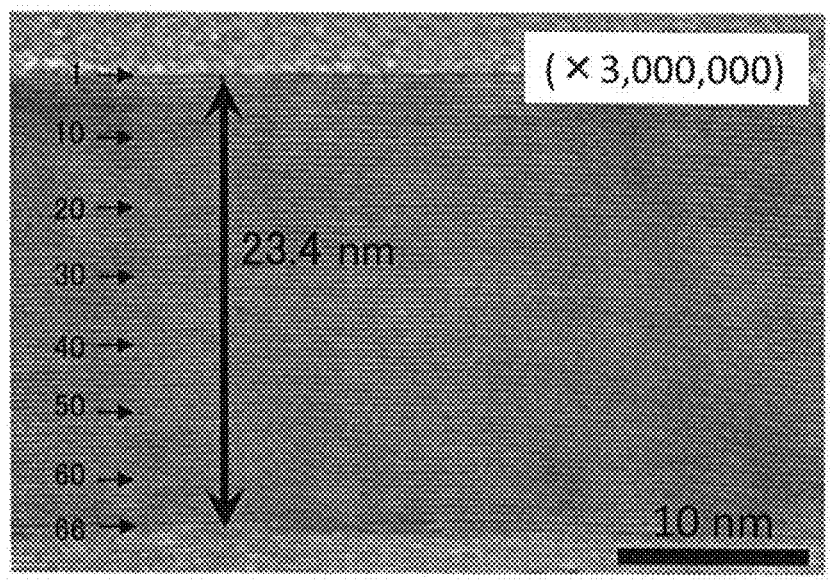
[Figure 2]
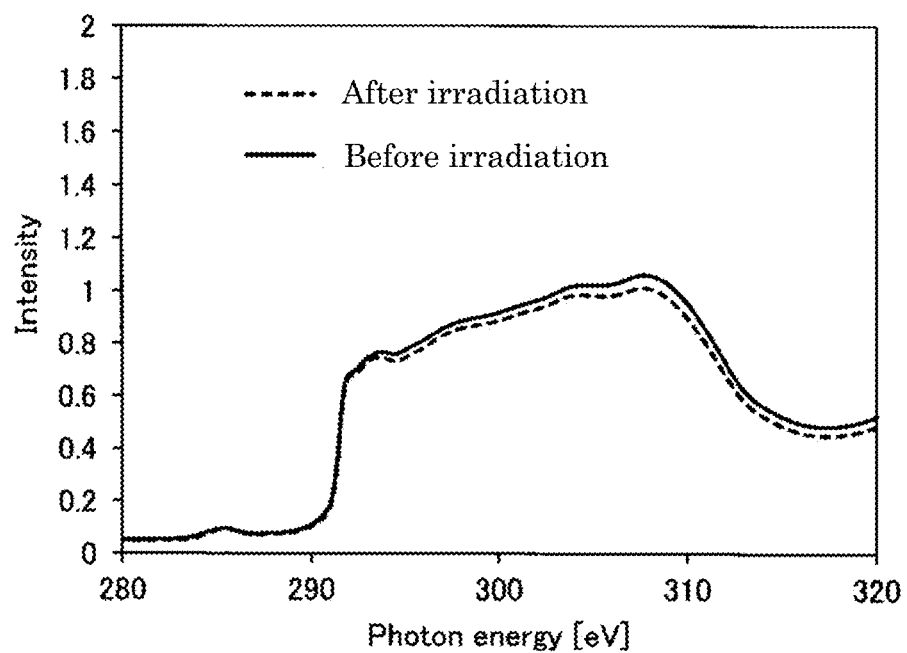

PELLICLE COMPRISING GRAPHITE THIN FILM

TECHNICAL FIELD

One or more embodiments of the present disclosure relate to a pellicle that includes a graphite thin film having a high and uniform transmittance of extreme ultraviolet (hereinafter, also described as EUV).

BACKGROUND

Recently, a technique of EUV lithography is being developed in finer semiconductor processing. A pellicle is used as a dust-proof protection film for attachment to a photomask in photolithography equipment with EUV.

As the pellicle, graphene having a film thickness of less than 1 nm is known (Patent Document 1). Patent Document 1 describes that the graphene having a film thickness of less than 1 nm has a high transmittance of extreme ultraviolet.

PATENT DOCUMENT

Patent Document 1: JP2013-534727A

Non-Patent Documents

Non patent Document 1: K. Nagashio, et al., J. Appl. Phys., 49, 051304(2010)
Non patent Document 2: Y. Zhang, et al., Appl. Phys. Lett., 86, 073104(2005)

SUMMARY

Conventional pellicles, however, require improvement in achieving both a high EUV transmittance and a uniformity in EUV transmittance.

Thus, one or more embodiments of the present disclosure may provide a pellicle achieving both a high EUV transmittance and a uniformity in EUV transmittance.

[1] A pellicle comprising a graphite thin film,
the graphite thin film having a surface roughness Sa of 0.1 nm or more and 500 nm or less, and
the graphite thin film having a film thickness of 5 nm or more and 30 nm or less.
[2] The pellicle according to [1], wherein
the graphite thin film has a film thickness of 5 nm or more and 20 nm or less.
[3] The pellicle according to [1] or [2], wherein
the graphite thin film has a density of 2.10 $g/cm^3$ or more and 2.26 $g/cm^3$ or less.
[4] The pellicle according to any one of [1] to [3], wherein
the graphite thin film has a surface roughness Sa of 1 nm or more and 350 nm or less.
[5] The pellicle according to any one of [1] to [4], wherein
the graphite thin film has a ratio (I (D)/I (G)) of a D-band intensity (I (D)) to a G-band intensity (I (G)) in a Raman spectrum of 0 or more and 0.5 or less.
[6] A pellicle composite comprising:
the pellicle according to any one of [1] to [5]; and
a frame.
[7] A method for producing a pellicle,
the pellicle comprising a graphite thin film,
the method comprising a step of baking a carbonized film under tension at a temperature of 2200° C. or more to give the graphite thin film, and
the graphite thin film having a surface roughness Sa of 0.1 nm or more and 500 nm or less and a film thickness of 5 nm or more and 30 nm or less.
[8] The method for producing a pellicle according to [7], the method further comprising a step of carbonizing a polymer film under tension to give the carbonized film.
[9] The method for producing a pellicle according to [7] or [8], wherein
the carbonized film is baked while sandwiched between pieces of graphite in at least a part of the baking.
[10] The method for producing a pellicle according to [8] or [9], wherein
the polymer film is carbonized while sandwiched between pieces of graphite.

A pellicle of one or more embodiments of the present disclosure can achieve both a high EUV transmittance and a uniformity in EUV transmittance.

BRIEF DESCRIPTION OF THE DRAWINGS

FIG. 1 is a photograph obtained by observing a section of a graphite thin film used in Example 1 with a transmission electron microscope (TEM) and serving as a substitute for a drawing.

FIG. 2 is an X-ray absorption fine structure (XAFS) in a region of a carbon K-shell absorption edge (C-K edge) in Comparative Example 8.

DETAILED DESCRIPTION

In one or more embodiments of the present disclosure, the EUV refers to light having a wavelength of 5 nm to 30 nm. In the present specification, the phrase A to B means A or more and B or less.

<Pellicle Including Graphite Thin Film>

One or more embodiments of the present disclosure relate to a pellicle that includes a graphite thin film having a film thickness of 5 nm to 30 nm and a surface roughness Sa of 0.1 nm to 500 nm.

According to Non-Patent Documents 1 and 2, graphene that is a multilayer but has a thickness of 5 nm or more exhibits behaviors clearly different from those of monolayer graphene or multilayer graphene having a thickness of less than 5 nm in terms of carrier mobility and temperature dependence of electrical conductivity. The physical properties of the multilayer graphene having a thickness of 5 nm or more may be considered to be almost the same as the physical properties of a graphite crystal. In FIG. 1 of Example 1 described later, multilayer graphene in which each graphene is stacked one another in a state of streaks is observed. As the multilayer graphene also has a film thickness of 5 nm or more, the pellicle of one or more embodiments of the present disclosure can be determined to be formed of a graphite thin film having a graphite structure. Accordingly, the graphite thin film constituting the pellicle of one or more embodiments of the present disclosure is clearly distinguished from so-called graphene (that is, monolayer graphene or multilayer graphene having a thickness of less than 5 nm). The film thickness measured by TEM observation is shown in FIG. 1 for reference.

<Film Thickness of Graphite Thin Film>

The graphite thin film forming the pellicle of one or more embodiments of the present disclosure has a film thickness of 5 nm to 30 nm, preferably 5 nm to 20 nm, particularly preferably 5 nm to 18 nm, from the viewpoints of EUV transmittance, uniformity in EUV transmittance, and film strength. The graphite thin film having a film thickness of 5 nm or more enables an excellent uniformity in EUV transmittance and a high film strength. The graphite thin film having a film thickness of 30 nm or less enables an excellent EUV transmittance and a uniformity in EUV transmittance.
<Method for Measuring Film Thickness>

The film thickness of the graphite thin film specified in one or more embodiments of the present disclosure is defined by a value obtained from the EUV transmittance. The EUV transmittance can be obtained by scanning a surface of the film, and a change of the film thickness according to the position can be obtained.

A relationship between the EUV transmittance (T) and the film thickness of the graphite thin film is represented by the following equation with use of 13.5-nm transmittance (0.998) of monolayer graphene and the film thickness (0.3354 nm) of the monolayer graphene.

$$\text{Film thickness (nm)} = \text{Log}_{0.998}(T[\%]/100) \times 0.3354$$

Measuring the film thickness by cross-sectional TEM observation leads to evaluation of the film thickness only by one point of the film, and the measured value sometimes has an error of up to about 10%.
<Film-Thickness Error of Graphite Thin Film>

The graphite thin film forming the pellicle of one or more embodiments of the present disclosure has a film-thickness error of preferably 10% or less, more preferably 5% or less, particularly preferably 3% or less, from the viewpoint of uniformity in EUV transmittance. The graphite thin film having a film-thickness error of 10% or less enables an excellent uniformity in EUV transmittance. The film-thickness error is represented by a ratio of standard deviation of the film thickness to the average film thickness, i.e., the following equation.

$$\text{Film-thickness error (\%)} = \text{standard deviation/average film thickness} \times 100(\%)$$

<Area of Graphite Thin Film>

The graphite thin film forming the pellicle of one or more embodiments of the present disclosure can have an area of, for example, 3 $cm^2$ or more and has an area of preferably 20 $cm^2$ or more, more preferably 30 $cm^2$ or more, further preferably 40 $cm^2$ or more. The graphite thin film of one or more embodiments of the present disclosure can secure sufficient strength even with such a large area and is handled well. The graphite thin film has an area of preferably 12 cm×15 cm or more that is larger than a photomask, more preferably 20 cm×20 cm or more, particularly preferably 25 cm×40 cm or more. The upper limit of the area of the graphite thin film is not particularly limited but is, for example, 50 cm×50 cm.
<Surface Roughness of Graphite Thin Film>

The graphite thin film forming the pellicle of one or more embodiments of the present disclosure has a surface roughness (Sa) of 0.1 nm or more and 500 nm or less. The graphite thin film has a surface roughness of preferably 1 nm or more, more preferably 3 nm or more, further preferably 5 nm or more, and preferably 350 nm or less, more preferably 200 nm or less, further preferably 100 nm or less. The surface roughness Sa in one or more embodiments of the present disclosure means an arithmetic average height obtained on the basis of ISO 25178. When even having the same film thickness but having a larger surface roughness, the graphite thin film has a lower EUV transmittance. Further, as a uniformity in EUV transmittance becomes low, the graphite thin film preferably has a smaller surface roughness. The surface roughness (Sa) is preferably measured using a laser microscope. The measurement position of the surface roughness (Sa) is not particularly limited, but it is desirable to measure surface roughness at a plurality of locations including a central portion and an end portion and define the average of values at the locations as the surface roughness (Sa).
<Density of Graphite Thin Film>

The graphite thin film forming the pellicle of one or more embodiments of the present disclosure has a density of preferably 1.80 $g/cm^3$ to 2.26 $g/cm^3$, more preferably 2.00 $g/cm^3$ to 2.26 $g/cm^3$, further preferably 2.10 $g/cm^3$ to 2.26 $g/cm^3$, particularly preferably 2.20 $g/cm^3$ to 2.26 $g/cm^3$, from the viewpoint of film strength.
<Number of Layers of Graphite Thin Film>

A relationship between the number of graphene layers and the film thickness of the graphite thin film forming the pellicle of one or more embodiments of the present disclosure is represented by the following equation.

$$\text{Number of graphene layers of graphite thin film} = \text{film thickness (nm)/film thickness (0.3354 nm) of monolayer graphene}$$

The graphite thin film forming the pellicle of one or more embodiments of the present disclosure includes preferably 15 to 90 graphene layers, more preferably 15 to 60 graphene layers, particularly preferably 15 to 54 graphene layers. The graphite thin film including 15 or more graphene layers enables an excellent uniformity in EUV transmittance and a high film strength. The graphite thin film including 90 or less graphene layers enables an excellent EUV transmittance and an excellent uniformity in EUV transmittance.
<Raman Spectrum of Graphite Thin Film>

The graphite thin film forming the pellicle of one or more embodiments of the present disclosure can be evaluated by laser Raman measurement that allows determination of whether the film is of carbon or graphite. In the laser Raman spectroscopy, a G-band attributed to a graphite structure appears at around 1575 to 1600 $cm^{-1}$, and a D-band attributed to an amorphous carbon structure appears at around 1350 to 1360 $cm^{-1}$. A ratio (($I(D)/I(G)$)) between a G-band intensity ($I(G)$) and a D-band intensity ($I(D)$) in a Raman spectrum is preferably 0 or more and 0.5 or less, more preferably 0 or more and 0.1 or less, particularly preferably 0 or more and 0.05 or less.

The Raman spectrum is preferably observed using a Raman microscope. A measurement position of the Raman spectrum is not particularly limited, but it is desirable to measure a part that has high film smoothness and is uniform in film thickness and a state of a surface irradiated with laser. A wavelength of the laser light used in the Raman spectroscopy is not particularly limited. Examples of a wavelength of general laser light include 1064 nm, 633 nm, 532 nm, 515 nm, 502 nm, 496 nm, 488 nm, 477 nm, 473 nm, 466 nm, 458 nm, 364 nm and 351 nm.
<EUV Transmittance of Graphite Thin Film>

The graphite thin film forming the pellicle of one or more embodiments of the present disclosure has a transmittance of 13.5-nm-wavelength light (EUV) of preferably 80% or more, more preferably 85% or more, further preferably 90% or more, particularly preferably 95% or more. The graphite film with higher EUV transmittance is more preferable. The upper limit value achievable by the graphite thin film forming the pellicle of one or more embodiments of the present disclosure, however, is usually about 99%.
<Uniformity in EUV Transmittance>

In one or more embodiments of the present disclosure, the graphite thin film has a surface roughness Sa of 0.1 nm or more and 500 nm or less, and has, in the film, an excellent uniformity in EUV transmittance. The uniformity in EUV transmittance can be evaluated with a value of three times (3σ) the standard deviation of the EUV transmittance obtained by scanning an upper surface of the film. The value is, for example, 1.5% or less, preferably 1.3% or less, more preferably 1.2% or less, and the lower limit is not particularly limited but is, for example, about 0.3%.

<Thermal Conductivity of Graphite Thin Film>

The graphite thin film forming the pellicle of one or more embodiments of the present disclosure has a thermal conductivity along a film plane direction of preferably 1000 W/mK to 5000 W/mK, more preferably 1500 W/mK to 5000 W/mK, particularly preferably 2000 W/mK to 5000 W/mK, from the viewpoint of releasing heat generated in the pellicle not to excessively raise the temperature. The graphite thin film having a thermal conductivity along the film plane direction of 1000 W/mK or more can efficiently release heat generated in the pellicle to improve durability of the pellicle.

<Electrical Conductivity of Graphite Thin Film>

The graphite thin film forming the pellicle of one or more embodiments of the present disclosure preferably has an electrical conductivity of 10,000 S/cm to 25,000 S/cm.

<Carrier Mobility of Graphite Thin Film>

The graphite thin film forming the pellicle of one or more embodiments of the present disclosure preferably has a carrier mobility of 10,000 $cm^2$/Vs to 15,000 $cm^2$/Vs.

<Tensile Strength of Graphite Thin Film>

The graphite thin film forming the pellicle of one or more embodiments of the present disclosure has a tensile strength of preferably 5 MPa to 100 MPa, more preferably 50 MPa to 100 MPa, particularly preferably 80 to 100 MPa. The graphite thin film having a tensile strength of 5 MPa or more enables handling such as tense stretching over a frame without damage.

<Refractive Index of Graphite Thin Film>

The graphite thin film used in the pellicle of one or more embodiments of the present disclosure preferably has a refractive index at 550 nm of 1.9 to 4.0.

<Proportion of Carbon in Graphite Thin Film>

The graphite thin film forming the pellicle of one or more embodiments of the present disclosure preferably contains 95 to 100% by mole of carbon in entire composition, from the viewpoint of outgas and durability to EUV.

<Crystal State of Graphite Thin Film>

The graphite thin film forming the pellicle of one or more embodiments of the present disclosure preferably has an excellent crystal state. For example, smaller Raman spectrum intensity ratio I (D)/I (G) (preferably 0.5 or less, more preferably 0) means a smaller proportion of the amorphous structure and an excellent crystal state. The crystal state is desirably a monocrystal state or a polycrystalline state. The graphite thin film having a monocrystal structure is preferable in terms of its high film strength and high thermal conductivity. On the other hand, a polycrystalline graphite thin film is easily produced and preferable in terms of costs.

<Durability to EUV>

The pellicle of one or more embodiments of the present disclosure has excellent durability to EUV as evaluated in examples described later.

<Method for Producing Graphite Thin Film>

The method for producing the graphite thin film is not particularly limited, and examples of the method include a polymer film baking method, an arc-discharge method using a carbon solid as a raw material, a plasma CVD method using a hydrocarbon-based gas as a raw material, and a plasma jet method using a methane gas as a raw material and performed in vacuum.

The method for producing the graphite thin film forming the pellicle of one or more embodiments of the present disclosure and having a smooth surface is preferably a polymer baking method. For example, the graphite thin film having a smooth surface, i.e., having its surface roughness adjusted to 0.1 nm or more and 500 nm or less is obtained by subjecting a polymer film such as an aromatic polyimide to a carbonization heat treatment to give a carbonized film and subjecting the carbonized film to a graphitization heat treatment under tension. A specific method for applying a tension to the carbonized film is, for example, sandwiching the carbonized film between pieces of graphite or placing a weight on an end portion of the carbonized film, and these procedures may be performed in at least a part of the graphitization heat treatment (baking).

Further, it is preferable to subject the polymer film to the carbonization heat treatment under tension and thus obtain a carbonized film and to subject the carbonized film to the graphitization heat treatment under tension.

The carbonization heat treatment may be performed at about 900 to 1000° C. for 15 to 30 minutes in an atmosphere of an inert gas such as nitrogen, argon, or a mixed gas of argon and nitrogen. A heating rate to the carbonization heat treatment temperature is not particularly limited but is, for example, 5° C./min or more and 15° C./min or less. After the carbonization heat treatment, the carbonized film may be cooled to room temperature by natural cooling or the like.

The carbonized film obtained by the carbonization heat treatment is subjected to a graphitization heat treatment such that the carbonized film is set in a high-temperature furnace and heat-treated (baked) at 2200° C. or more (preferably 2600° C. or more) for 15 to 30 minutes in an inert gas such as an argon gas or a mixed gas of an argon gas and a helium gas. The heat treatment temperature in the graphitization is more preferably 2800° C. or more, further preferably 3000° C. or more. The upper limit is not particularly limited but is, for example, 3600° C. or less. In the graphitization, it is important to heat-treat the carbonized film with applying tension, for example, by placing a weight on an end portion of the carbonized film. These procedures can obtain the graphite thin film having its surface roughness adjusted. A heating rate to the graphitization heat treatment temperature is not particularly limited but is, for example, 5° C./min or more and 15° C./min or less.

The polymer preferably used as a raw material for the graphite thin film is an aromatic polymer, and the aromatic polymer is preferably at least one selected from polyamide, polyimide, polyquinoxaline, polyp araphenylene vinylene, polyoxadiazole, polybenzimidazole, polybenzoxazole, polybenzthiazole, polyquinazolinedione, polybenzoxazinone, polyquinazolone, a benzimidazobenzophenanthroline ladder polymer, or derivatives of these polymers. The films formed of these polymers may be produced by known production methods. As a particularly preferable polymer, an aromatic polyimide, polyparaphenylene vinylene, and polyparaphenylene oxadiazole can be exemplified. Particularly, an aromatic polyimide is preferable. Especially, an aromatic polyimide is particularly preferable that is prepared through polyamic acid obtained from a dianhydride (particularly an aromatic dianhydride) and a diamine (particularly an aromatic diamine), which are described below.

Examples of the dianhydride that can be used for synthesis of the aromatic polyimide include pyromellitic dianhydride, 2,3,6,7-naphthalenetetracarboxylic dianhydride, 3,3', 4,4'-biphenyltetracarboxylic dianhydride, 1,2,5,6-naphthalenetetracarboxylic dianhydride, 2,2',3,3'-biphenyltetracarboxylic dianhydride, 3,3',4,4'- benzophenonetetracarboxylic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfone dianhydride, p-phenylene bis(trimellitic monoester anhydride), ethylene bis(trimellitic monoester anhydride), bisphenol A bis(trimellitic monoester anhydride), and analogs thereof. The compounds can be used singly or as a mixture in any ratio. Pyromellitic dianhydride and 3,3'4,4'-biphenyltetracarboxylic dianhydride are particularly preferable, particularly from the viewpoint of the fact that as the polyimide film has a very stiffer polymer structure, the polyimide film is more highly oriented and from the viewpoint of availability.

Examples of the diamine that can be used for synthesis of the aromatic polyimide include 4,4'-diaminodiphenylpropane, 4,4'-diaminodiphenylmethane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether, 3,3'-diaminodiphenyl ether, 3,4'-diaminodiphenyl ether, 1,5-diaminonaphthalene, 4,4'-diaminodiphenyldiethylsilane, 4,4'-diaminodiphenylsilane, 4,4'-diaminodiphenylethylphosphineoxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, and analogs thereof. The compounds can be used singly or as a mixture in any ratio. The aromatic polyimide is particularly preferably synthesized using 4,4'-diaminodiphenyl ether or p-phenylenediamine as a raw material, from the viewpoint of further increasing the orientation of the polyimide film, and availability.

When the polymer is an aromatic polyimide, the production method may be either a thermal curing method or a chemical curing method. The thermal curing method is a method in which polyamic acid as a precursor is converted into an imide by heating. The chemical curing method is a method in which polyamic acid is converted into an imide using a dehydrating agent represented by an anhydride such as acetic anhydride or using a tertiary amine such as picoline, quinoline, isoquinoline, or pyridine, as an imidization accelerator. The chemical curing method is preferable, because the resultant film easily have a small linear coefficient of expansion, a high elasticity, and a large birefringence index, and the film is not damaged and have a good-quality even when a tension is applied to the film during baking. The chemical curing method is excellent also in terms of improving the degree of thermal conductance of the graphite film.

The polyamic acid is usually produced by dissolving at least one dianhydride and at least one diamine in an organic solvent, and stirring the resultant organic solvent solution of polyamic acid under controlled temperature conditions until the polymerization of the dianhydride and the diamine is completed. These solutions of polyamic acid are obtained at a concentration of usually 4% by mass or more (preferably 5% by mass or more) and 35% by mass or less, preferably 10% by mass or more and 30% by mass or less. The solution of polyamic acid at a concentration of this range can give an appropriate molecular weight and appropriate viscosity of the solution. It is preferable to set the dianhydride and the diamine in the raw-material solution at substantially equimolar amounts, and the mole ratio of the dianhydride to the diamine (dianhydride/diamine) is, for example, 1.5/1 or less and 1/1.5 or more, preferably 1.2/1 or less and 1/1.2 or more, more preferably 1.1/1 or less and 1/1.1 or more.

The polyimide film is produced by casting the polyimide precursor, the organic solvent solution of polyamic acid onto a support such as an endless belt or a stainless-steel drum, and drying and imidizing the solution. Specifically, the method for producing the film by chemical curing is as follows. First, a dehydrating agent of a stoichiometric amount or more and an imidization accelerator of a catalytic amount are added to the solution of polyamic acid, and the mixture is cast or applied onto a supporting plate, an organic film (e.g., PET), or a support (e.g., a drum or an endless belt) to form a film shape and the organic solvent is evaporated to give a film having self-supportability. Next, the film is further imidized while heated and dried, to give a polyimide film. The temperature in the heating is preferably from 150° C. to 550° C. The polymer film preferably has a thickness of, for example 20 to 200 nm.

<Pellicle Formed of Stacked Body Including Graphite Thin Film and Another Film>

Further, the pellicle of one or more embodiments of the present disclosure may be formed of a stacked body in which the graphite thin film and another film are stacked. The pellicle formed of the stacked body can give heat resistance and hydrogen radical resistance.

The other film is not particularly limited but is, for example, a film formed of $SiO_x$ ($x \leq 2$), $Si_xN_y$ (x/y is 0.7 to 1.5), SiO, SiC, N, $Y_2O_3$, YN, Mo, Ru, Rb, Sr, Y, Zr, Nb, or Rh, from the viewpoint of a stable material with respect to EUV.

<Pellicle Composite>
<Pellicle Frame>

The pellicle of one or more embodiments of the present disclosure may be a pellicle formed of a composite including the graphite thin film and a pellicle frame. A method for tensely stretching the pellicle over the pellicle frame is not particularly limited. For example, the method may be a method using a film adhesive material layer or a method for tensely stretching the pellicle by mechanically sandwiching the pellicle from above and below.

<Shape of Pellicle Frame>

A shape of the pellicle frame does not matter as long as an area of the pellicle enough for covering a photomask can be secured. The shape may be a circle or an oval, or may be a polygonal shape such as a tetragon, or another different shape. The pellicle frame that is polygonal may have roundish corners. The pellicle frame may also have a ventilation hole for equalizing its atmospheric pressure with the atmospheric pressure in an EUV exposure device.

<Material for Pellicle Frame>

A material for the pellicle frame is not limited as long as the frame allows tense stretching of the pellicle. Examples of the material include single metals such as silicon, aluminum, and stainless steel, alloys, graphite, and ceramic.

The film adhesive is, for example, an acrylic resin adhesive, an epoxy resin adhesive, a polyimide resin adhesive, or a silicone resin adhesive. The film adhesive preferably causes less outgassing, from the viewpoint of retaining the degree of vacuum during EUV exposure. As a method for evaluating the outgassing, for example, a thermal desorption spectrometer can be used. As the pellicle and the pellicle frame are heated by irradiation with EUV, the film adhesive preferably has high heat resistance.

The present application claims priority based on Japanese Patent Application No. 2018-043100 filed on Mar. 9, 2018.

All the contents described in Japanese Patent Application No. 2018-043100 filed on Mar. 9, 2018 are incorporated herein by reference.

EXAMPLES

Hereinafter, one or more embodiments of the present disclosure may be more specifically described with reference to examples. The one or more embodiments of present disclosure, however, are not limited by the following examples but can also be absolutely carried out with appropriate changes to the examples within a scope in compliance with the intent described above and below, and all the changes are to be encompassed within a technical scope of one or more embodiments of the present disclosure.

The graphite thin films and the pellicles (pellicle composites) obtained in the examples below were measured by the following methods.

<Method for Measuring Film Thickness>

A film thickness of the film was calculated from the EUV transmittance measured by the following method. The EUV transmittance is obtained by scanning a surface of the film according to the following measurement method. A relationship between the EUV transmittance (T) and the film thickness of the graphite thin film is represented by the following equation with use of 13.5-nm-wavelength light transmittance (0.998) of monolayer graphene and the film thickness (0.3354 nm) of the monolayer graphene.

$$\text{Film thickness (nm)} = \text{Log}_{0.998}(T[\%]/100) \times 0.3354$$

<Surface Roughness (Sa)>

In one or more embodiments of the present disclosure, the surface roughness (Sa) of the film was obtained by measurement with a laser microscope and calculation based on ISO 25178. The laser microscope was set at a magnification of 50 times and a cutoff value ($\lambda$c) of 80 µm. The measurement position of the surface roughness (Sa) is not particularly limited, but it is desirable to measure surface roughness at a plurality of locations including one central portion and four end portions and define the average of values at the locations as the surface roughness (Sa).

<Measurement of EUV Transmittance>

The measurement of EUV transmittance was performed as follows. The pellicle was irradiated with 13.5-nm-wavelength light (EUV) using EUV irradiation equipment (NewSUBARU (facility name) BL-10, University of Hyogo). EUV was irradiated so as to scan a surface of the film with setting a light source intensity at several dozen µW/cm$^2$ and setting an irradiation direction of EUV vertical to the film surface, and the EUV transmittance was measured.

<Uniformity in EUV Transmittance>

The uniformity in EUV transmittance is represented by a value of three times (3$\sigma$) the standard deviation of the EUV transmittance obtained by scanning a surface of the film. Smaller value of 3$\sigma$ means better uniformity in EUV transmittance.

<Durability to EUV>

The pellicle was irradiated with EUV having a wavelength of 13.5 nm and a light source intensity of approximately 170 mW/cm$^2$ for 2 hours using EUV irradiation equipment (NewSUBARU (facility name) BL-9, University of Hyogo). The durability to EUV was evaluated by comparing (1) the appearance, (2) the XAFS at the C-K edge, or (3) the Raman spectrum, between before and after the durability test.

(1) The evaluation of durability to EUV by the appearance was performed by observing with an optical microscope whether a color of the pellicle was changed between before and after the irradiation. The pellicle without color change between before and after the irradiation was defined as having durability.

(2) The evaluation of durability to EUV by the C-K edge XAFS measurement was performed as follows. The pellicle was irradiated at one point with EUV using EUV irradiation equipment (NewSUBARU (facility name) BL-10, University of Hyogo), and an absorption spectrum in the range of 265 to 355 eV was obtained. The light source intensity was set at several dozen µW/cm$^2$, and the irradiation direction of EUV was set vertical to the film surface. The pellicle without change between before and after the irradiation was defined as having durability.

The XAFS at the C-K edge of a material containing carbon exhibits a $\pi^*$ peak at around 285.5 eV typical of sp$^2$ carbon and a $\sigma^*$ peak at around 293 eV. These peaks represent a form of bonding of carbon atoms, and no change in the XAFS at the C-K edge between before and after the irradiation with EUV means that the pellicle formed of the graphite thin film has durability to EUV.

(3) The evaluation of durability to EUV by the Raman spectrum is performed by defining the pellicle having a change of 5% or less in the value of I (D)/I (G) between before and after the irradiation with EUV as having durability.

<Density>

The dimensions and the film thickness of the graphite thin film were measured, and the volume (cm$^3$) of the graphite thin film was calculated. Separately, the mass (g) of the graphite thin film was measured, and the density of the graphite thin film was calculated by the equation density (g/cm$^3$)=mass (g)/volume (cm$^3$).

<Electrical Conductivity>

The electrical conductivity of the graphite thin film was measured by the van der Pauw method. This method is the most appropriate method for measuring the electrical conductivity of a thin film-shaped sample. The details of the measurement method is described in Experimental chemistry 9 (fourth series) electricity and magnetism (edited by The Chemical Society of Japan, issued by Maruzen Co., Ltd., (issued on Jun. 5, 1991 (Heisei 3)) p. 170). This approach is characterized by a point that electrodes are arranged at any four points of end portions in a thin film sample having any shape, to allow the measurement of the electrical conductivity and that accurate measurement can be performed when the sample has a uniform thickness. In one or more embodiments of the present disclosure, the measurement was performed by using a 1 cm×1 cm sample and attaching a silver paste electrode to each of four corners of the sample. The measurement was performed using Resistivity/DC & AC Hall measurement system, ResiTest 8300 manufactured by TOYO Corporation.

<Tensile Strength>

The graphite thin film was cut out into a size of 10×30 mm, and the cut-out film was reinforced at both ends with a 12.5-µm-thick polyimide tape. The measurement sample prepared was set in a vertical motorized test stand (EMX-1000N manufactured by IMADA CO., LTD.). The tensile speed was set at 5 mm/min, and the tensile strength was measured by a digital force gauge (ZTA-5N manufactured by IMADA CO., LTD.).

<Proportion of Carbon>

The proportion of carbon in the graphite thin film prepared was measured using a scanning electron microscope (SEM) SU4600 manufactured by Hitachi High-Tech Corporation and a large-diameter silicon drift detector (SDD)

(EDX-XMax) manufactured by HORIBA, Ltd. The proportion of carbon was determined by carbon-atom concentration (%) calculated after assaying the graphite thin film at an accelerating voltage of 20 kV and analyzing the assay with accompanying software.

<Crystal State>

The crystal state of the film was evaluated by the ratio (I (D)/I (G)) between the G-band intensity (I (G)) and the D-band intensity (I (D)) in a Raman spectrum. The film having a ratio I (D)/I (G) of 0.5 or less is evaluated as having an excellent graphite crystal with less defects. The ratio I (D)/I (G) is preferably 0.

<Method for Measuring Raman Intensity>

The Raman intensity was measured with a laser Raman microscope. The measurement position is not particularly limited, but it is desirable to measure values at a plurality of locations including one central portion and four end portions and use the average of respective values of the G-band intensity (I (G)) and the D-band intensity (I (D)) at the locations.

Hereinafter, polyimide films (A-1) to (A-7), which were raw materials for the graphite thin film, were produced in Production Examples 1-1 to 1-7.

Production Example 1-1: Preparation of Polyimide Film (A-1)

A 5.0% by mass DMF (dimethylformamide) solution of polyamic acid synthesized from pyromellitic dianhydride, 4,4'-diaminodiphenyl ether, and p-phenylenediamine in the mole ratio of 2:1:1 was synthesized, and the solution was applied onto a metal substrate with a spin coater. The stacked body including the metal foil and the solution of polyamic acid was heated at 125° C., 250° C., 450° C. for 60 seconds each, and then the metal foil was peeled to prepare a polyimide film (A-1) that was an 8-cm-diameter circle and had a film thickness of 110 nm.

Production Example 1-2: Preparation of Polyimide Film (A-2)

A polyimide film (A-2) that was an 8-cm-diameter circle and had a film thickness of 90 nm was prepared in the same manner as in Production Example 1-1 except that the concentration of the polyamic acid was set at 4.0% by mass.

Production Example 1-3: Preparation of Polyimide Film (A-3)

A polyimide film (A-3) that was an 8-cm-diameter circle and had a film thickness of 150 nm was prepared in the same manner as in Production Example 1-1 except that the concentration of the polyamic acid was set at 6.0% by mass.

Production Example 1-4: Preparation of Polyimide Film (A-4)

A polyimide film (A-4) that was an 8-cm-diameter circle and had a film thickness of 220 nm was prepared in the same manner as in Production Example 1-1 except that the concentration of the polyamic acid was set at 9.0% by mass.

Production Example 1-5: Preparation of Polyimide Film (A-5)

A polyimide film (A-5) that was an 8-cm-diameter circle and had a film thickness of 280 nm was prepared in the same manner as in Production Example 1-1 except that the concentration of the polyamic acid was set at 9.0% by mass.

Production Example 1-6: Preparation of Polyimide Film (A-6)

A polyimide film (A-6) that was an 8-cm-diameter circle and had a film thickness of 3900 nm was prepared in the same manner as in Production Example 1-1 except that the concentration of the polyamic acid was set at 17.0% by mass.

Production Example 1-7: Preparation of Polyimide Film (A-7)

A polyimide film (A-7) that was an 8-cm-diameter circle and had a film thickness of 500 nm was prepared in the same manner as in o Production Example 1-1 except that the concentration of the polyamic acid was set at 12.0% by mass.

Next, a graphite thin film was prepared using any one of the polyimide films (A-1) to (A-7) in Production Examples 2-1 to 2-11.

Production Example 2-1: Preparation of Graphite Thin Film (B-1)

The polyimide film (A-1) obtained in Production Example 1-1 was sandwiched between graphite sheets and heated to 950° C. at a rate of 5° C./min using an electric furnace in a nitrogen gas atmosphere, kept at 950° C. for 20 minutes, and then naturally cooled to give a carbonized film. A weight was placed on an end portion of the resultant carbonized film, and the carbonized film was heated under tension to 2800° C. at a rate of 5° C./min in an argon gas atmosphere, kept at 2800° C. for 20 minutes, and then naturally cooled to give a graphite thin film (B-1) having an about 2 to 3-cm-diameter circular shape.

The film thickness of the graphite thin film (B-1) measured by the EUV transmittance was 18.5 nm, and the surface roughness (Sa) of the graphite thin film (B-1) was 314 nm. The surface state of the graphite thin film (B-1) was a mirrored surface. The electrical conductivity of the graphite thin film (B-1) was 15,000 S/cm.

FIG. 1 shows a photograph obtained by observing a section of the graphite thin film (B-1) with a TEM. Based on FIG. 1, multilayer graphene, in which each graphene is stacked one another in a state of streaks can be confirmed, having a film thickness of 5 nm or more, so that the graphite thin film (B-1) is found to have a graphite structure.

Production Example 2-2: Preparation of Graphite Thin Film (B-2)

A graphite thin film (B-2) was obtained in the same manner as in Production Example 2-1 except that the polyimide film (A-2) obtained in Production Example 1-2 was used replacing the polyimide film (A-1) obtained in Production Example 1-1.

The film thickness of the graphite thin film (B-2) measured by the EUV transmittance was 19.6 nm. The surface state of the graphite thin film (B-2) was a mirrored surface.

Production Example 2-3: Preparation of Graphite Thin Film (B-3)

A graphite thin film (B-3) was obtained in the same manner as in Production Example 2-1 except that the polyimide film (A-3) obtained in Production Example 1-3 was used replacing the polyimide film (A-1) obtained in Production Example 1-1.

The film thickness of the graphite thin film (B-3) measured by the EUV transmittance was 29.0 nm. The surface state of the graphite thin film (B-3) was a mirrored surface.

Production Example 2-4: Preparation of Graphite Thin Film (B-4)

A graphite thin film (B-4) was obtained in the same manner as in Production Example 2-1 except that the polyimide film (A-4) obtained in Production Example 1-4 was used replacing the polyimide film (A-1) obtained in Production Example 1-1.

The film thickness of the graphite thin film (B-4) measured by the EUV transmittance was 72.0 nm. The surface state of the graphite thin film (B-4) was a mirrored surface.

Production Example 2-5: Preparation of Graphite Thin Film (B-5)

A graphite thin film (B-5) was obtained in the same manner as in Production Example 2-1 except that the polyimide film (A-5) obtained in Production Example 1-5 was used replacing the polyimide film (A-1) obtained in Production Example 1-1.

The film thickness of the graphite thin film (B-5) measured by the EUV transmittance was 82.0 nm. The surface state of the graphite thin film (B-5) was a mirrored surface.

Production Example 2-6: Preparation of Graphite Thin Film (B-6)

A graphite thin film (B-6) was obtained in the same manner as in Production Example 2-1 except that the polyimide film (A-6) obtained in Production Example 1-6 was used replacing the polyimide film (A-1) obtained in Production Example 1-1.

The film thickness of the graphite thin film (B-6) measured by the EUV transmittance was more than 1000 nm. The surface state of the graphite thin film (B-6) was a mirrored surface.

Production Example 2-7: Preparation of Graphite Thin Film (B-7)

The polyimide film (A-3) obtained in Production Example 1-3 was sandwiched between graphite sheets and heated to 950° C. at a rate of 5° C./min using an electric furnace in a nitrogen gas atmosphere, kept at 950° C. for 20 minutes, and then naturally cooled to give a carbonized film. The resultant carbonized film was heated to 2800° C. at a rate of 5° C./min in an argon gas atmosphere, kept at 2800° C. for 20 minutes, and then naturally cooled to give a graphite thin film (B-7).

The film thickness of the graphite thin film (B-7) measured by the EUV transmittance was 17.5 nm. A surface of the graphite thin film (B-7) had wrinkles.

Production Example 2-8: Preparation of Graphite Thin Film (B-8)

A graphite thin film (B-8) was obtained in the same manner as in Production Example 2-7 except that the polyimide film (A-1) obtained in Production Example 1-1 was used replacing the polyimide film (A-3) obtained in Production Example 1-3.

The film thickness of the graphite thin film (B-8) measured by the EUV transmittance was 27.1 nm, and the surface roughness (Sa) of the graphite thin film (B-8) was 1353 nm. A surface of the graphite thin film (B-8) had wrinkles.

Production Example 2-9: Preparation of Graphite Thin Film (B-9)

A graphite thin film (B-9) was obtained in the same manner as in Production Example 2-7 except that the polyimide film (A-2) obtained in Production Example 1-2 was used replacing the polyimide film (A-3) obtained in Production Example 1-3.

The film thickness of the graphite thin film (B-9) measured by the EUV transmittance was 32.4 nm. A surface of the graphite thin film (B-9) had wrinkles.

Production Example 2-10: Preparation of Graphite Thin Film (B-10)

A graphite thin film (B-10) was obtained in the same manner as in Production Example 2-7 except that the polyimide film (A-4) obtained in Production Example 1-4 was used replacing the polyimide film (A-3) obtained in Production Example 1-3.

The film thickness of the graphite thin film (B-10) measured by the EUV transmittance was 76.0 nm. A surface of the graphite thin film (B-10) had wrinkles.

Production Example 2-11: Preparation of Graphite Thin Film (B-11)

A graphite thin film (B-11) was obtained in the same manner as in Production Example 2-1 except that the polyimide film (A-7) obtained in Production Example 1-7 was used replacing the polyimide film (A-1) obtained in Production Example 1-1. The tensile strength of the graphite thin film (B-11) was 40 MPa. The graphite thin films (B-1) to (B-3) that were prepared in the same manner using the same raw material as the graphite thin film (B-11) are considered to also have tensile strength equivalent to the tensile strength of the graphite thin film (B-11).

Hereinafter, pellicles formed of a graphite thin film and a pellicle frame were prepared using the graphite thin films (B-1) to (B-11).

Example 1

The graphite thin film (B-1) whose surface state was a mirrored surface and which had a film thickness of 18.5 nm was tensely stretched over a bottomless square jig to form a pellicle. The jig had an outside dimension of 12 mm square, an inside dimension of 10 mm square, and a height of 10 mm, and an A5052 alloy that was less likely to cause outgassing was used as the material for the jig. The pellicle was fixed using an epoxy resin adhesive.

The pellicle including the graphite thin film (B-1) had an EUV transmittance of 89.5%, which was measured by the method described above, and had a uniformity in EUV transmittance of 1.1%.

Example 2

A pellicle was obtained in the same manner as in Example 1 except that the graphite thin film (B-2) was used replacing the graphite thin film (B-1).

The pellicle including the graphite thin film (B-2) had an EUV transmittance of 88.9% and a uniformity in EUV transmittance of 1.3%.

Example 3

A pellicle was obtained in the same manner as in Example 1 except that the graphite thin film (B-3) was used replacing the graphite thin film (B-1).

The pellicle including the graphite thin film (B-3) had an EUV transmittance of 84.0% and a uniformity in EUV transmittance of 1.2%.

Comparative Example 1

A pellicle was obtained in the same manner as in Example 1 except that the graphite thin film (B-4) was used replacing the graphite thin film (B-1).

The pellicle including the graphite thin film (B-4) had an EUV transmittance of 64.8% and a uniformity in EUV transmittance of 1.2%.

Comparative Example 2

A pellicle was obtained in the same manner as in Example 1 except that the graphite thin film (B-5) was used replacing the graphite thin film (B-1).

The pellicle including the graphite thin film (B-5) had an EUV transmittance of 61.0% and a uniformity in EUV transmittance of 1.4%.

Comparative Example 3

A pellicle was obtained in the same manner as in Example 1 except that the graphite thin film (B-6) was used replacing the graphite thin film (B-1).

The pellicle including the graphite thin film (B-6) had an EUV transmittance of 0%.

Comparative Example 4

A pellicle was obtained in the same manner as in Example 1 except that the graphite thin film (B-7) was used replacing the graphite thin film (B-1).

The pellicle including the graphite thin film (B-7) had an EUV transmittance of 90.0% and a uniformity in EUV transmittance of 4.0%.

Comparative Example 5

A pellicle was obtained in the same manner as in Example 1 except that the graphite thin film (B-8) was used replacing the graphite thin film (B-1).

The pellicle including the graphite thin film (B-8) had an EUV transmittance of 85.0% and a uniformity in EUV transmittance of 4.0%.

Comparative Example 6

A pellicle was obtained in the same manner as in Example 1 except that the graphite thin film (B-9) was used replacing the graphite thin film (B-1).

The pellicle including the graphite thin film (B-9) had an EUV transmittance of 82.3% and a uniformity in EUV transmittance of 1.9%.

Comparative Example 7

A pellicle was obtained in the same manner as in Example 1 except that the graphite thin film (B-10) was used replacing the graphite thin film (B-1).

The pellicle including the graphite thin film (B-10) had an EUV transmittance of 63.4% and a uniformity in EUV transmittance of 2.8%.

Comparative Example 8

A pellicle was obtained in the same manner as in Example 1 except that the graphite thin film (B-11) was used replacing the graphite thin film (B-1).

The pellicle including the graphite thin film (B-11) had an EUV transmittance of 49.4% and a uniformity in EUV transmittance of 1.1%.

Tables 1 and 2 show the measurement results of Examples 1 to 3 and Comparative Examples 1 to 8.

TABLE 1

| | | | Example 1 | Example 2 | Example 3 | Comparative example 1 | Comparative example 2 | Comparative example 3 |
|---|---|---|---|---|---|---|---|---|
| Polymer film | Production example No. of polymer film | | 1-1 | 1-2 | 1-3 | 1-4 | 1-5 | 1-6 |
| | Film No. | | A-1 | A-2 | A-3 | A-4 | A-5 | A-6 |
| | Thickness | (nm) | 110 | 90 | 150 | 220 | 280 | 3900 |
| | Concentration of polyamic acid | (wt %) | 5.0 | 4.0 | 6.0 | 9.0 | 9.0 | 17.0 |
| Constitution of graphite thin film | Production example No. of graphite thin film | | 2-1 | 2-2 | 2-3 | 2-4 | 2-5 | 2-6 |
| | Film No. | | B-1 | B-2 | B-3 | B-4 | B-5 | B-6 |
| | Thickness | (nm) | 18.5 | 19.6 | 29.0 | 72.0 | 82.0 | >1000 |
| | Film-thickness error | (%) | 3.5 | 4.1 | 2.6 | 1.4 | 1.5 | — |
| | Density | (g/cm$^3$) | 2.2 | 2.2 | 2.2 | 2.2 | 2.2 | 2.2 |
| | Number of layers | (layers) | 55.2 | 58.4 | 86.5 | 214.7 | 244.5 | >2981 |
| | Proportion of carbon | (%) | >99 | >99 | >99 | >99 | >99 | >99 |
| | Crystal state | | Excellent | Excellent | Excellent | Excellent | Excellent | Excellent |
| | Surface state | | Mirrored surface | Mirrored surface | Mirrored surface | Mirrored surface | Mirrored surface | Mirrored surface |
| | Surface roughness (Sa) | (nm) | 314 | — | — | — | — | — |

TABLE 1-continued

|  |  |  | Comparative example 4 | Comparative example 5 | Comparative example 6 | Comparative example 7 | Comparative example 8 |
|---|---|---|---|---|---|---|---|
| Polymer film | Production example No. of polymer film |  | 1-3 | 1-1 | 1-2 | 1-4 | 1-7 |
|  | Film No. |  | A-3 | A-1 | A-2 | A-4 | A-7 |
|  | Thickness | (nm) | 150 | 110 | 90 | 220 | 500 |
|  | Concentration of polyamic acid | (wt %) | 6.0 | 5.0 | 4.0 | 9.0 | 12.0 |
| Constitution of graphite thin film | Production example No. of graphite thin film |  | 2-7 | 2-8 | 2-9 | 2-10 | 2-11 |
|  | Film No. |  | B-7 | B-8 | B-9 | B-10 | B-11 |
|  | Thickness | (nm) | 17.5 | 27.1 | 32.4 | 76.0 | 117.9 |
|  | Film-thickness error | (%) | 11.6 | 3.5 | 3.7 | 3.2 | 5.3 |
|  | Density | (g/cm$^3$) | 2.2 | 2.2 | 2.2 | 2.2 | 2.2 |
|  | Number of layers | (layers) | 52.2 | 80.8 | 96.6 | 226.6 | 353.8 |
|  | Proportion of carbon | (%) | >99 | >99 | >99 | >99 | >99 |
|  | Crystal state |  | Excellent | Excellent | Excellent | Excellent | Excellent |
|  | Surface state |  | Wrinkles | Wrinkles | Wrinkles | Wrinkles | Mirrored surface |
|  | Surface roughness (Sa) | (nm) | — | 1353 | — | — | 25 |

TABLE 2

|  |  |  | Example 1 | Example 2 | Example 3 | Comparative example 1 | Comparative example 2 | Comparative example 3 |
|---|---|---|---|---|---|---|---|---|
| Graphen film No. |  |  | B-1 | B-2 | B-3 | B-4 | B-5 | B-6 |
| Evaluation of pellicle | EUV transmittance | (%) | 89.5 | 88.9 | 84.0 | 64.8 | 61.0 | 0.0 |
|  | Uniformity in EUV transmittance (3σ) | (%) | 1.1 | 1.3 | 1.2 | 1.2 | 1.4 | — |
|  | Intensity ratio of Raman spectrum before EUV irradiation | I(D)/I(G) | 0.02 (0.02*) | 0 | 0 | 0 | 0 | 0 |
|  | Evaluation by appearance between before and after EUV irraditaion |  | No change | No change | No change | No change | No change | No change |

|  |  |  | Comparative example 4 | Comparative example 5 | Comparative example 6 | Comparative example 7 | Comparative example 8 |
|---|---|---|---|---|---|---|---|
| Graphen film No. |  |  | B-7 | B-8 | B-9 | B-10 | B-11 |
| Evaluation of pellicle | EUV transmittance | (%) | 90.0 | 85.0 | 82.3 | 63.4 | 49.4 |
|  | Uniformity in EUV transmittance (3σ) | (%) | 4.0 | 4.0 | 1.9 | 2.8 | 1.1 |
|  | Intensity ratio of Raman spectrum before EUV irradiation | I(D)/I(G) | 0 | — | 0 | 0 | 0 |
|  | Evaluation by appearance between before and after EUV irraditaion |  | No change | No change | No change | No change | No change |

*The value in the parenthesis is an intensity ratio of Raman spectrum after EUV irradiation.

The measured surface roughness Sa of the graphite thin film in Example 1 was 314 nm. The graphite thin films in Examples 2 and 3 had a mirrored surface state very similar to the surface state in Example 1, so that the graphite thin films in Examples 2 and 3 are considered to have the surface roughness Sa equivalent to the value in Example 1. Thus, Examples 1 to 3, satisfying the requirement of one or more embodiments of the present disclosure, could achieve both an excellent EUV transmittance (80% or more) and an excellent uniformity in EUV transmittance (1.5% or less).

The pellicles in Examples 1 to 3 all had excellent durability to EUV. Further, FIG. 2 shows the result of evaluating the durability to EUV of the pellicle in Comparative Example 8 by the C-K edge XAFS measurement. According to FIG. 2, a change is hardly observed in the spectrum between before and after the irradiation with EUV, and the pellicle had excellent durability. The graphite thin films (B-1) to (B-3) that are thinner than the graphite thin film (B-11) have small absorption of EUV and are thus less likely to be affected by EUV. Accordingly, the graphite thin films (B-1) to (B-3) are said to have durability equivalent to or greater than the durability of the graphite thin film (B-11).

On the other hand, the graphite thin films in Comparative Examples 1 and 2 having a large film thickness had an excellent uniformity in EUV transmittance but had a low EUV transmittance. As the graphite thin films in Comparative Examples 3 and 8 have an excessively large film thickness, EUV didn't transmit through the films. Further, Comparative Examples 4 to 7 produced without application of a tension to the carbonized film during the graphitization heat treatment generated wrinkles on the surfaces of the graphite thin films. Because of the facts that the surface roughness Sa measured in Comparative Example 5 was 1353 nm, which did not satisfy the requirement of one or more embodiments of the present disclosure and that the surface states in Comparative Examples 4, 6, and 7 were very similar to the surface state in Comparative Example 5, the surface roughness in Comparative Examples 4, 6, and 7 are considered to be equivalent to the value in Comparative Example 5, and Comparative examples 4 to 7 all had a poor uniformity in EUV transmittance.

The pellicle of one or more embodiments of the present disclosure is usable in EUV exposure devices.

Although the disclosure has been described with respect to only a limited number of embodiments, those skilled in the art, having benefit of this disclosure, will appreciate that various other embodiments may be devised without departing from the scope of the present disclosure. Accordingly, the scope of the disclosure should be limited only by the attached claims.

The invention claimed is:

1. A pellicle comprising:
    a graphite thin film, wherein the graphite thin film has a surface roughness (Sa) of 0.1 nm or more and 500 nm or less,
    wherein the graphite thin film has a film thickness of 5 nm or more and 30 nm or less, and
    wherein the graphite thin film has a ratio (I (D)/I (G)) of a D-band intensity (I (D)) to a G-band intensity (I (G)) in a Raman spectrum of 0 or more and 0.5 or less.

2. The pellicle according to claim 1, wherein the graphite thin film has a film thickness of 5 nm or more and 20 nm or less.

3. The pellicle according to claim 1, wherein the graphite thin film has a density of 2.10 g/cm$^3$ or more and 2.26 g/cm$^3$ or less.

4. The pellicle according to claim 1, wherein the graphite thin film has a surface roughness (Sa) of 1 nm or more and 350 nm or less.

5. A pellicle composite comprising:
    the pellicle according to claim 1; and
    a frame.

6. The pellicle according to claim 1, wherein the graphite thin film is multiple graphene layers in which each graphene layer is stacked on one another and the number of graphene layers is 15 or more.

7. The pellicle according to claim 1, wherein the graphite thin film has a ratio (I (D)/I (G)) of a D-band intensity (I (D)) to a G-band intensity (I (G)) in a Raman spectrum of 0 or more and 0.1 or less.

8. The pellicle according to claim 1, wherein the graphite thin film contains 99% or more by moles of carbon.

9. The pellicle according to claim 1, wherein the graphite thin film has an electrical conductivity of 10,000 S/cm or more.

10. A method for producing a pellicle,
    wherein the pellicle comprises a graphite thin film,
    wherein the method comprises baking a carbonized film under tension at a temperature of 2200° C. or more to give the graphite thin film,
    wherein the graphite thin film has a surface roughness (Sa) of 0.1 nm or more and 500 nm or less and a film thickness of 5 nm or more and 30 nm or less, and
    wherein the graphite thin film has a ratio (I (D)/I (G)) of a D-band intensity (I (D)) to a G-band intensity (I (G)) in a Raman spectrum of 0 or more and 0.5 or less.

11. The method for producing the pellicle according to claim 10, the method further comprising a step of carbonizing a polymer film under tension to give the carbonized film.

12. The method for producing the pellicle according to claim 10, wherein the carbonized film is baked while sandwiched between pieces of graphite in at least a part of the baking.

13. The method for producing the pellicle according to claim 11, wherein the polymer film is carbonized while sandwiched between pieces of graphite.

* * * * *